US007919975B2

(12) United States Patent
Ryu

(10) Patent No.: US 7,919,975 B2
(45) **Date of Patent: *Apr. 5, 2011**

(54) DIFFERENTIAL SIGNALING SYSTEM AND FLAT PANEL DISPLAY WITH THE SAME

(75) Inventor: Jee-youl Ryu, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 184 days.

This patent is subject to a terminal disclaimer.

(21) Appl. No.: 12/060,321

(22) Filed: Apr. 1, 2008

(65) Prior Publication Data

US 2008/0238442 A1 Oct. 2, 2008

(30) Foreign Application Priority Data

Apr. 2, 2007 (KR) ........................ 10-2007-0032573

(51) Int. Cl.
*G01R 31/26* (2006.01)

(52) U.S. Cl. .................................................. 324/760.01

(58) Field of Classification Search ............... 324/158.1, 324/763–765, 769, 770, 147, 156, 163, 236; 345/50, 204, 207, 690; 327/147, 156, 163, 327/236

See application file for complete search history.

(56) References Cited

U.S. PATENT DOCUMENTS 3,714,552 A * 1/1973 Hirschel ........................ 324/301
5,309,108 A * 5/1994 Maeda et al. ................. 324/501
5,351,000 A * 9/1994 Farwell ........................ 324/76.77
6,130,795 A * 10/2000 Freitas et al. ................... 360/67
6,194,918 B1 * 2/2001 Fransson et al. ................ 327/41
6,320,406 B1 * 11/2001 Morgan et al. .................. 326/14
6,356,096 B2 * 3/2002 Takagi et al. ................. 324/765
6,456,096 B1 * 9/2002 Ericson et al. ................ 324/707
6,650,149 B1 * 11/2003 Wong .............................. 327/65
(Continued)

FOREIGN PATENT DOCUMENTS

KR 2005-113479 12/2005
(Continued)

OTHER PUBLICATIONS

Notice of Allowance issued in corresponding Korea Patent Application No. 10-2007-0032573 dated Jun. 25, 2008.

*Primary Examiner* — Ha Tran Nguyen
*Assistant Examiner* — Joshua Benitez
(74) *Attorney, Agent, or Firm* — Stein McEwen, LLP

(57) ABSTRACT

A differential signaling system, wherein a first wiring and a second wiring are coupled between a sending end and a receiving end as a differential signal line. A termination resistor is coupled between the first wiring and the second wiring in the receiving end side. A test circuit is coupled to the termination resistor in parallel, and amplifies and detects a variation of a differential impedance due to the differential signal line. The test circuit includes: a differential test amplifier for amplifying a variation in the differential impedance of the first wiring or the second wiring; a switching unit installed at an input terminal of the differential test amplifier for controlling an operation of the differential test amplifier; and a peak detector for converting an output signal of the differential test amplifier into a direct current component; and a phase detector for detecting a skew, a time delay, and/or a phase difference of a signal inputted to the differential signal line.

19 Claims, 5 Drawing Sheets

U.S. PATENT DOCUMENTS 6,856,158 B2 * 2/2005 Frame et al. ............ 324/762.01
6,891,532 B2 * 5/2005 Nara et al. .................... 345/204
6,894,505 B2 * 5/2005 Gohel .......................... 324/539
6,895,535 B2 * 5/2005 Sunter et al. .................. 714/704
6,946,804 B2 * 9/2005 You ........................... 315/169.4
7,053,000 B2 * 5/2006 Anderson et al. ............ 438/707
7,081,878 B2 * 7/2006 Choi .............................. 345/99
7,126,403 B2 * 10/2006 Kenney et al. ................ 327/291
7,135,902 B1 * 11/2006 Ziazadeh et al. .............. 327/158
7,236,018 B1 * 6/2007 Wang et al. ................... 327/108
7,239,849 B2 * 7/2007 Bereza et al. .............. 455/67.14
7,279,908 B2 * 10/2007 Blake ........................... 324/647
7,746,150 B2 * 6/2010 Wong et al. ................... 327/335
2002/0024366 A1 * 2/2002 Ooishi et al. .................. 327/156
2003/0159200 A1 * 8/2003 Elrod ................................ 2/456
2003/0201968 A1 * 10/2003 Itoh et al. ...................... 345/102
2008/0238443 A1 * 10/2008 Ryu ............................. 324/629

FOREIGN PATENT DOCUMENTS

KR 2006-2535 1/2006
KR 2006-27168 3/2006
KR 2006-65352 6/2006

* cited by examiner

DIFFERENTIAL SIGNALING SYSTEM AND FLAT PANEL DISPLAY WITH THE SAME

CROSS-REFERENCE TO RELATED APPLICATION

This application claims the benefit of Korean Application No. 2007-32573, filed Apr. 2, 2007, in the Korean Intellectual Property Office, the disclosure of which is incorporated herein by reference.

BACKGROUND OF THE INVENTION

1. Field of the Invention

Aspects of the present invention relate to a flat panel display that uses a signal transmission method that transmits a differential signal, and more particularly to a flat panel display that includes a differential signaling system for matching impedance in the signal transmission method.

2. Description of the Related Art

In general, a cathode ray tube (CRT) is one of display devices which have been in wide use as a monitor for a television, a measuring instrument, or an information terminal. However, since the CRT is heavy and large, it is not suitable to miniaturization and light-weight requirements of smaller electronic devices.

Accordingly, in order to replace the CRT, various flat panel displays, such as a liquid crystal display (LCD), a plasma display panel (PDP), a field emission display (FED), and an organic light emitting display (OLED) have been studied and developed, which have advantages in light of miniaturization, lighter weight, and low electric power consumption requirements. The above described flat panel displays include various components and wirings for transmitting signals between the components.

Recently, aided by the development in electronic circuits and manufacturing process technologies, signals can be transmitted through the wirings at high speeds. To meet the high speed signal transmission requirements, a drive speed of the components has also become high.

Accordingly, various methods for transmitting the high speed signals between the components through the wirings have been adopted. For example, a signal transmission method such a low voltage differential signaling (LVDS) method or a reduced swing differential signaling (RSDS) method for transmitting a differential signal has been used.

A differential signaling system transmits a signal having different modes but having a same amplitude and a different polarity through a differential transmission line. Accordingly, the differential signaling system tends to remove a concentrated magnetic field and tends to couple an electric field. Accordingly, a high speed signal can be stably transmitted without a signal reflection, a skew (phase delay), or electro magnetic interference (EMI) due to the coupled electric field.

A typical flat panel display will be described with reference the accompanying drawings in detail.

FIG. 1 is a block diagram showing a composition of a flat panel display. With reference to FIG. 1, the flat panel display includes a display panel 40, a gate driver 20, a data driver 30, and a controller 10. Pixels (not shown) are arranged at the display panel 40 in a matrix pattern. The gate driver 20 sequentially applies a scan signal to gate wirings of the display panel 40. The data driver 30 applies an image signal DATA1 to data wirings of the display panel 40. The controller 10 applies the image signal DATA1 from an external graphic controller (not shown) to the data driver 30, and applies a control signal CS1 to the gate driver 20 and the data driver 30 in order to control a drive timing. In the flat panel display, after all gate wirings of the display panel 40 are sequentially scanned and the image signal DATA1 is applied to the pixels through the data wirings to display one frame of an image, a vertical synchronous signal VSYNC is applied to display a next frame of the image.

FIG. 2 is a block diagram showing a controller 110 and a data driver 130 in detail. FIG. 3 is a view showing a signal transmission method between the controller 110 and the data driver 130. With reference to FIG. 2, the data driver 130 comprises a plurality of data driving circuits 132. The plurality of data driving circuits 132 receive image signals DATA [+,−] from the controller 110 through first and second wirings W1 and W2, and receive a control signal CS11 from the controller 110 through a third wiring W3.

The data driving circuits 132 receive image signals DATA [+,−] from the controller 110, and output the image signals DATA [+,−] to the data wirings according to the control signal CS11 from the controller 110. Although not shown in the drawings, a plurality of data wirings are electrically coupled to the data driving circuits 132, and applies the image signals DATA [+,−] that are applied to the data driving circuits 132 and to the pixels. Here, the image signals DATA [+,−] from the controller 110 are transmitted to the respective data driving circuits using the aforementioned differential signal transmission method.

FIG. 3 shows a signal transmission method between the controller 110 and the data driver 130 using a representative diagram of the controller 110, the data driver 130, and a connection thereof. As shown in FIG. 3, in order to transmit data (as image signals DATA [+,−]), an arrangement of differential transmission lines, namely, first and second wirings W1 and W2, is provided between the controller 110 being a sending end Tx and the data driving circuit 132 being a receiving end Rx. A termination resistor $R_t$ is provided between the differential transmission lines at the receiving end (data driving circuit 132) side. The termination resistor $R_t$ electrically connects the first wiring W1 and the second wiring W2 to each other, and the first wiring W1 and the second wiring W2 are coupled to each data driving circuit 132.

Accordingly, the image signal DATA [+] applied through the first wiring W1 is transferred back to the controller 110 through the termination resistor $R_t$ and the second wiring W2. The termination resistor $R_t$ prevents an excessive current from flowing in the data driving circuit 132, and a voltage across the termination resistor $R_t$ is the image signals DATA [+,−], which are applied to the data driving circuit 132.

A plurality of electric components and wirings are provided in the flat panel display, which are electrically coupled to each other. Since the electric components and wirings have impedance values, a signal is attenuated during transmission of the signal between the electric components. That is, the controller 110 and the data driving circuits 132 have impedance values. Further, the first and second wirings W1 and W2 for connecting the controller 110 and the data driving circuits 132 have an impedance value of Z0.

If the impedance value Z0 of the first wirings W1 and W2 is different from that of the data driving circuits 132, namely, when an impedance mismatch occurs, the image signals DATA [+,−] are not accurately supplied to the data driving circuits 132. That is, a part of the image signals DATA [+,−] is reflected and discharged.

In detail, a reflection coefficient Γ is expressed by a following equation 1.

$$\Gamma = \frac{Z_{diff} - R_t}{Z_{diff} + R_t} \quad \text{[Equation 1]}$$

where, a differential impedance $Z_{diff}$ is a value that is less than a sum (2Z0) of impedance values of the first and second wirings W1,W2, and has a different value according to variations in a manufacturing process and a composition of the flat panel display.

Namely, when the differential impedance $Z_{diff}$ is identical with a value of the termination resistor $R_t$, a reflection loss of the signals does not occur due to the matched impedances. However, the differential impedance $Z_{diff}$ varies in practice. Accordingly, in the typical case, the impedance matching (or matched impedance) is not normally achieved when using the differential signal transmission method. When a reflection wave occurs due to mismatched impedances, an interference with the image signals DATA [+,−] applied through the first wiring W1 occurs to cause an unstable wave, and distortion and attenuation of the image signals DATA [+,−]. Also, the electro magnetic interference (EMI) deteriorates an image quality of the flat panel display.

Accordingly, in the differential signaling method, whether the impedance matching is achieved or whether a minute variation of differential impedance $Z_{diff}$ occurs should always be monitored. However, since a typical method for detecting the minute variation in the differential impedance $Z_{diff}$ has a long measuring time and uses measuring equipment of high cost, its disadvantages include increased testing cost and low detection rate for a minute variation in the differential impedance $Z_{diff}$.

SUMMARY OF THE INVENTION

Accordingly, it is an aspect of the present invention to provide a differential signaling system which may clearly detect a presence of an impedance matching by a test circuit in a flat panel display that uses a differential signal transmission method and to more accurately perform the impedance matching through the detection thereof in order to stably transmit a high speed signal without an electro magnetic interference, wherein the test circuit detects a variation of a differential impedance and converts the amplified signal into a direct current component, to thereby easily detect the presence of the impedance matching, and a flat panel display with the same.

It is another aspect of the present invention is to provide a differential signaling system, which measures a skew, time delay, and/or a phase difference of a differential signal inputted to or transmitted in the differential transmission line, to measure time delay of the signal due to a variation of an impedance in the differential transmission line, so that an impedance matching is more accurately performed through the measurement thereof in order to stably transmit a high speed signal without an electro magnetic interference, and a flat panel display with the same.

The foregoing and/or other aspects of the present invention are achieved by providing a differential signaling system including: a differential signal line having a first wiring and a second wiring coupled between a sending end and a receiving end of the system; a termination resistor coupled between the first wiring and the second wiring in the receiving end side of the system; and a test circuit coupled to the termination resistor in parallel to amplify and to detect a variation of a differential impedance due to the differential signal line, wherein the test circuit includes: a differential test amplifier to amplify the variation in the differential impedance of the first wiring or the second wiring; a switching unit installed at an input terminal of the differential test amplifier for controlling an operation of the differential test amplifier; and a peak detector to convert an output signal of the differential test amplifier into a direct current component; and a phase detector to detect a phase difference of a signal transmitted in the differential signal line.

According to an aspect of the present invention, the test circuit is positioned at an outside of the receiving end. The differential test amplifier has input impedance value and an amplification gain value. The peak detector is embodied by a peak detector having a detection constant of 1. Also, the phase detector includes another switching unit, which is coupled to the first and second wirings.

According to another aspect of the present invention, there is provided a flat panel display including: a display panel in which a plurality of data wirings and gate wirings are arranged to intersect each other; a controller to receive an image signal from an exterior and to generate a control signal, and to output the image signal and the control signal through a differential signal line having the first and second wirings; a gate driver to receive the control signal from the controller and to apply a scan signal to the gate wirings; a data driver including a plurality of data driving circuits to receive an image signal and/or a control signal from the controller through the first and second wirings and to apply the image signal to the data wirings; and a test circuit coupled to the termination resistor in parallel to amplify and to detect a variation of a differential impedance due to the differential signal line, wherein the test circuit includes: a differential test amplifier to amplify the variation in the differential impedance of the first wiring or the second wiring; a switching unit installed at an input terminal of the differential test amplifier used for controlling an operation of the differential test amplifier; and a peak detector to convert an output signal of the differential test amplifier into a direct current component; and a phase detector to detect a phase difference of a differential signal transmitted in the differential signal line.

According to an aspect of the present invention, a differential signaling circuit includes: a sending end and a receiving end of the differential signaling circuit; a first wiring and a second wiring to connect the sending end and the receiving end, and to carry a differential signal between the sending end and the receiving end; and a test circuit positioned at the receiving end and connected to the first and second wirings, the test circuit detecting a phase difference of a differential signal transmitted in the differential signal line which is indicative of an impedance variance in the differential signaling circuit.

According to an aspect of the present invention, a method of detecting a variance in an impedance of a differential signaling circuit includes: transmitting a differential signal over a first wiring and a second wiring of the differential signaling circuit to connect a sending end and a receiving end of the differential signaling circuit; and detecting a skew or a time delay in different modes of the differential signal, which is indicative of an impedance variance in the differential signaling circuit.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
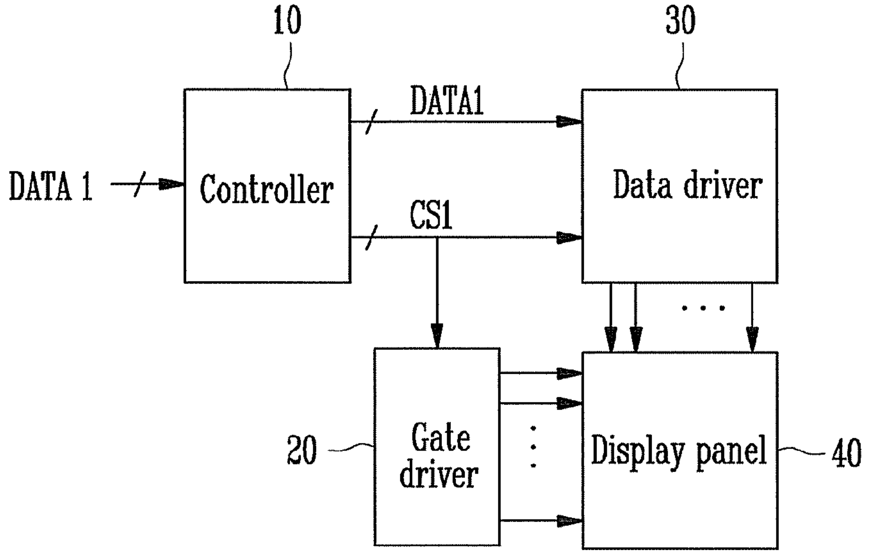
FIG. 1 (PRIOR ART)
FIG. 1 is a block diagram showing a composition of a typical flat panel display.
Figure 2:
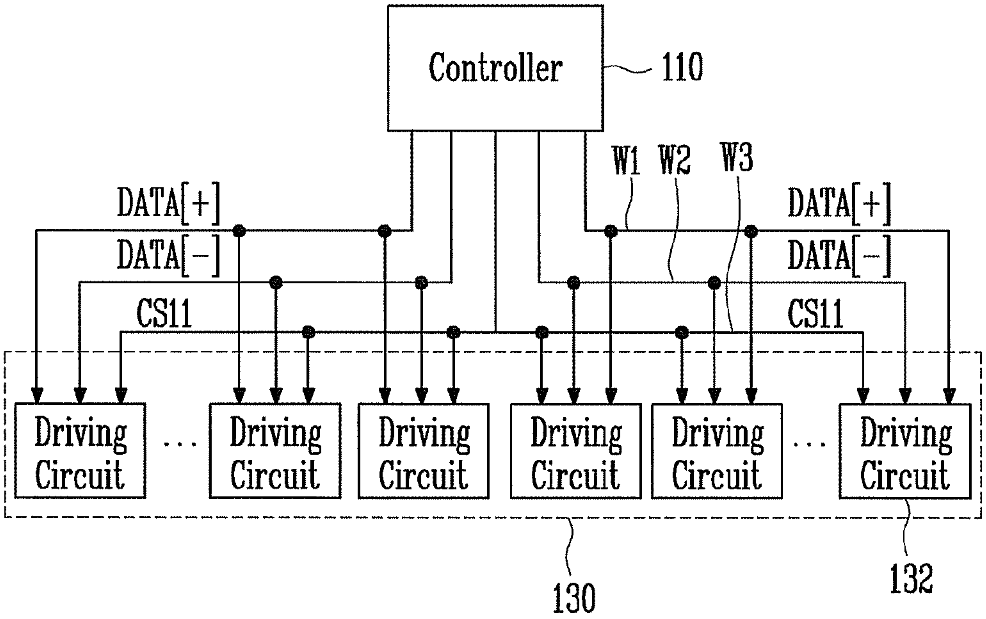
FIG. 2 (PRIOR ART)
FIG. 2 is a block diagram showing a controller and a data driver of FIG. 1 in detail.
Figure 3:
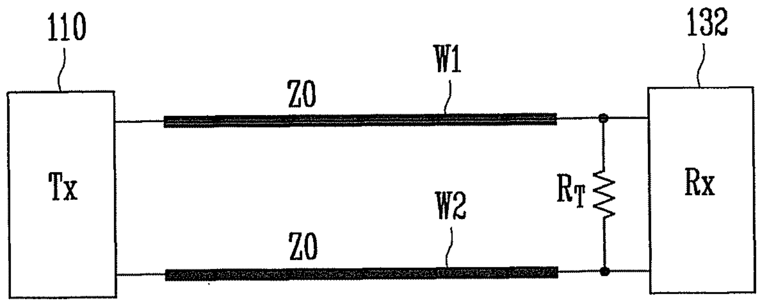
FIG. 3 (PRIOR ART)
FIG. 3 is a view showing a signal transmission method between the controller and the data driver using a representative diagram of the controller, the data driver, and a connection thereof.

Reference will now be made in detail to the aspects of the present invention, examples of which are illustrated in the accompanying drawings, wherein like reference numerals refer to the like elements throughout. The aspects are described below in order to explain the present invention by referring to the figures.

Here, when one element is coupled to another element, the one element may be not only directly coupled to another element but also indirectly coupled to another element via yet another element. Further, some elements are not shown for clarity. Also, like reference numerals refer to like elements throughout.

Figure 4:
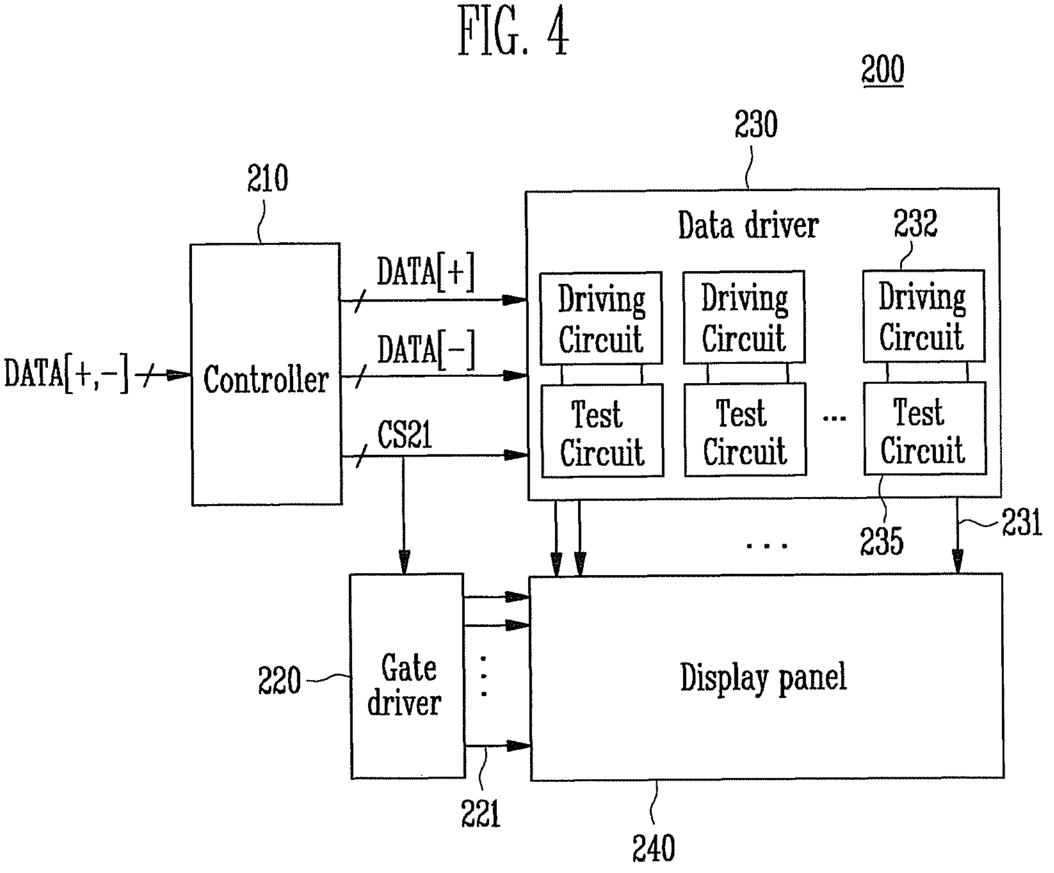
FIG. 4 is a block diagram showing a composition of a flat panel display according to an aspect of the present invention.

FIG. 4 is a block diagram showing a composition of a flat panel display 200 according to an aspect of the present invention. With reference to FIG. 4, the flat panel display 200 includes a display panel 240, a gate driver 220, a data driver 230, and a controller 210. Gate lines (or wirings) 221 and data lines (or wirings) 231 are arranged to intersect each other on the display panel 240. The gate driver 220 sequentially applies a scan signal to the gate wirings 221 of the display panel 240. The data driver 230 applies image signals DATA [+,−] to the data wirings 231 of the display panel 240. The controller 210 applies the image signals DATA [+,−] from an external graphic controller (not shown) to the data driver 230, and applies a control signal CS21 to the gate driver 220 and the data driver 230 in order to control a drive timing.

Further, a flat panel display 200 uses a signal transmission method for transmitting a differential signal (also referred to as a differential signaling method). In the flat panel display 200, a test circuit 235 is attached to each driving circuit 232 of the data driver. The test circuit 235 detects a presence of an impedance matching (or matched impedance) when using the differential signaling method. The test circuit 235 is coupled to a receiving end side of an arrangement (such as a circuit) using the differential signaling method, and amplifies a minute variation of a differential impedance in the arrangement to clearly detect the presence of an impedance matching. Moreover, the test circuit 235 measures skew or time delay from a phase difference of the differential signal inputted to (or transmitted in) the differential transmission line, to thereby measure the time delay of the differential signal due to the variation of the differential impedance in the transmission line.

In the display panel 240, a plurality of gate wirings 221 are arranged to be spaced apart from each other at a constant (or regular) interval in a transverse direction, and a plurality of data wirings 231 are arranged to be spaced apart from each other at a constant (or regular) interval in a longitudinal direction. The gate wirings 221 and the data wirings 231 intersect each other to divide a plurality of regions of the display panel 240. The regions are referred to as ‘pixels’. The pixels are electrically coupled to the gate wirings 221 and the data wirings 231, and are arranged on the display panel 240 in a matrix pattern.

The controller 210 represents a timing controller. The controller 210 receives the image signals DATA [+,−] from an exterior thereof (such as an external graphic controller (not shown)) and generates various control signals CS21 to drive the flat panel display 200. The controller 210 applies the image signals DATA [+,−] to the data driver 230, and applies the control signals CS21 to the gate driver 221 and the data driver 230 to control the drive timing. Here, the controller 210 applies a vertical synchronous signal VSYNC, a horizontal synchronous signal HSYNC, a clock signal, a gate start signal, and a data output enable signal to the gate driver 220 and the data driver 230 as the control signals CS21 to control the drive timing of the gate driver 220 and the data driver 230.

That is, the controller 210 applies the horizontal synchronous signal HSYNC and the gate start signal to the gate driver 220 to sequentially apply a scan signal to the gate wirings 221 of the display panel 240. Further, the controller 220 applies the horizontal synchronous signal HSYNC, the data output enable signal, and the image signals DATA [+,−] to the data driver 230, so that the image signals DATA [+,−] are applied to pixels of the gate wiring 221 to which the scan signal is applied. This causes the drive timing of the gate driver 220 and the data driver 230 to be controlled.

The data driver 230 is electrically coupled to the display panel 240 through the data wirings 231. The data driver 230 comprises a plurality of the data driving circuits 232. Each of the data driving circuits 232 receives the image signals DATA [+,−] and the control signals CS21 from the controller 210, and outputs them to the data wirings 231.

The test circuit 235 is coupled to input terminals of each data driving circuit 232. Here, the data driving circuit 232 receives the image signals DATA [+,−] from the controller 210. The test circuit 235 amplifies a minute variation of a differential impedance from the controller 210 to the data driving circuits 232 to clearly detect the presence of the impedance matching. In aspects of the present invention, the test circuit 235 amplifies a minute variation of the differential impedance by first detecting the minute variation of the differential impedance, outputting a voltage (or a variation thereof) corresponding to the minute variation of the differential impedance, and then amplifying the voltage (or the variation thereof).

Moreover, the test circuit 235 functions to measure the skew or the time delay from a phase difference of the differential signal inputted to (or transmitted in) the differential transmission line, to thereby measure the time delay of the differential signal due to the variation of differential impedance in the transmission line. Here, as shown, the test circuit 235 can be mounted at the receiving end of the arrangement that uses the differential signaling method, namely, at an inside of the driving circuit 232. However, as shown in FIG. 4, for a user's control convenience, the test circuit 235 can be installed at an outside of the data driving circuit 232.

The following is a detailed composition and operation of the test circuit 235 with reference to the accompanying drawings. As shown in FIG. 4, the gate driver 220 receives control signals CS21 from the controller 210, and sequentially applies a scan signal to the gate wirings 221 to drive the pixels arranged in a matrix pattern. The data driver 230 applies the image signals DATA [+,−] to the pixels to which the scan signal is applied, through the data wirings 231.

Through the aforementioned operation, after all the gate wirings 221 of the display panel 240 are sequentially scanned and the image signals DATA [+,−] are applied to the pixels through the data wirings 231 to display one frame of an image, the vertical synchronous signal VSYNC is applied to display a next frame of the image.

Figure 5:
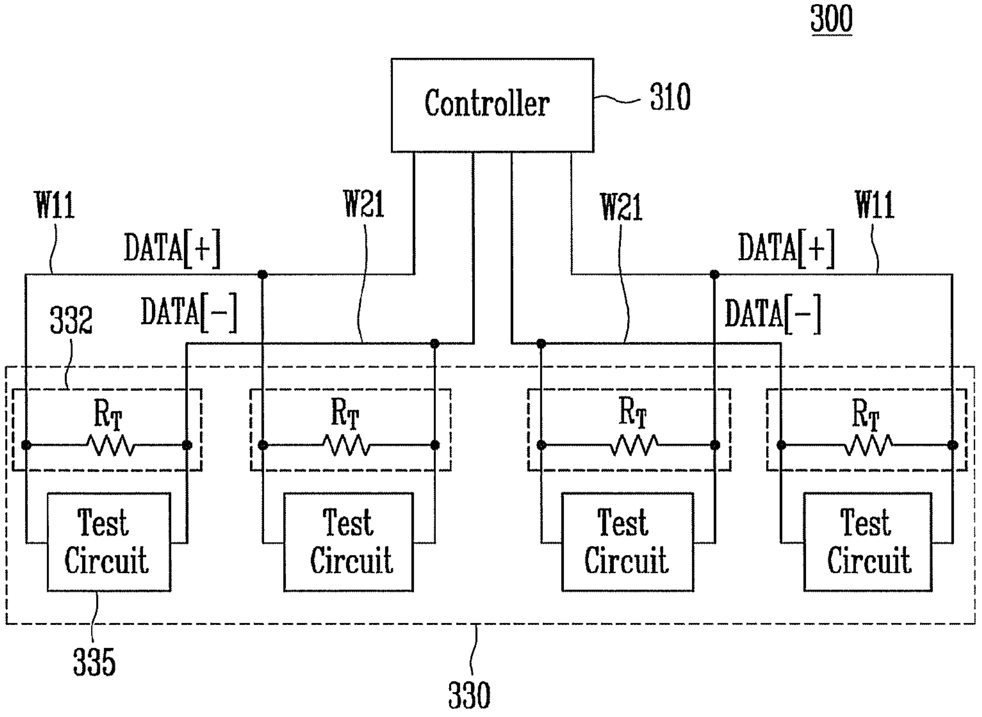
FIG. 5 is a detailed view showing an aspect of the controller and the data driver shown in FIG. 4.
Figure 6:
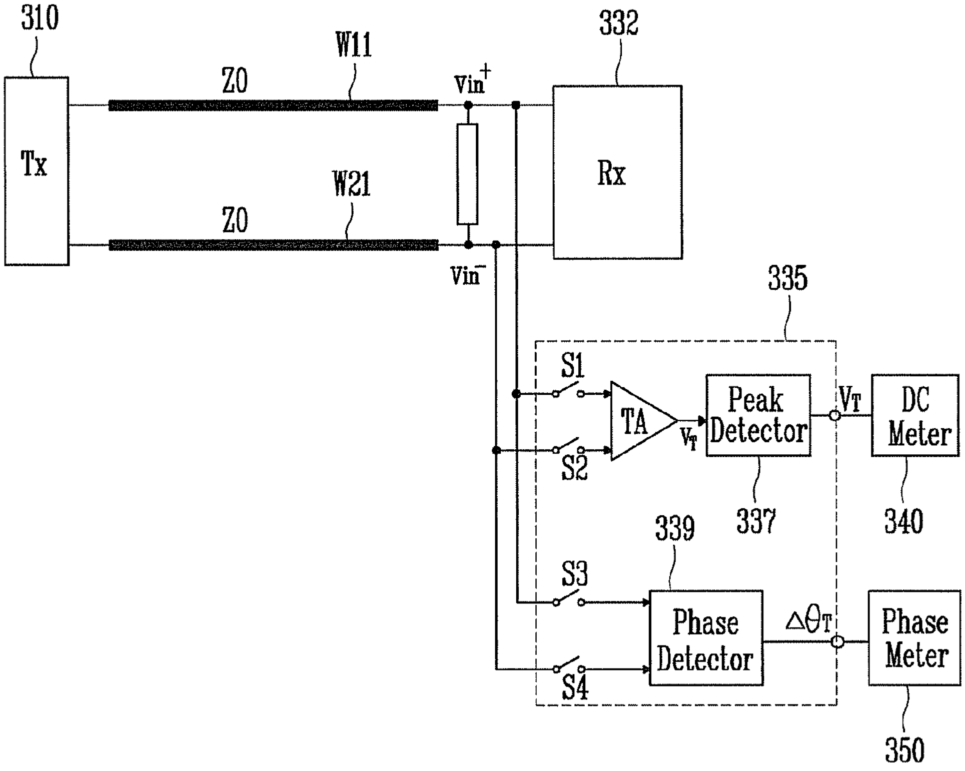
FIG. 6 is a block diagram showing a differential signaling system according to an aspect of the present invention.
Figure 7:
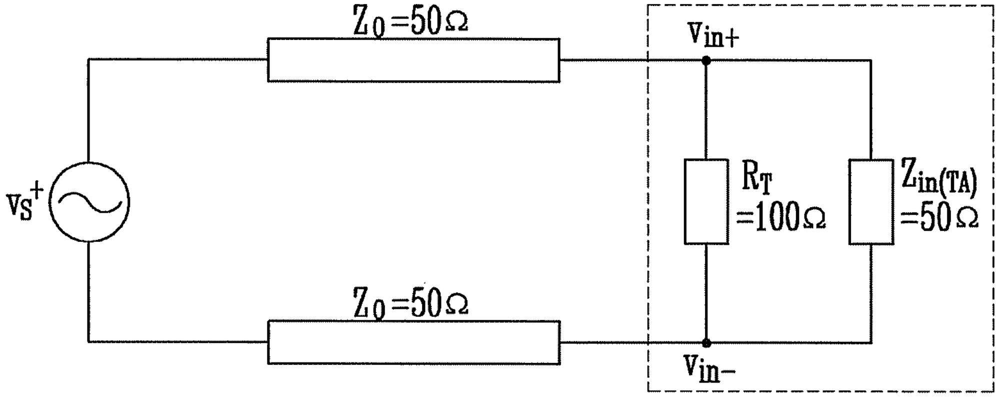
FIG. 7 is an equivalent circuitry diagram of the differential signaling system shown in FIG. 6.
Figure 8:
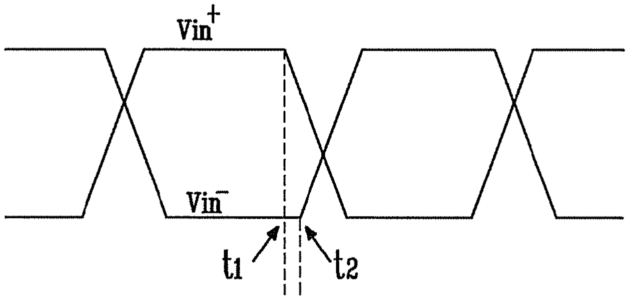
FIG. 8 is a timing chart showing a differential signal with a skew.

FIG. 5 is a detailed view showing an aspect of the controller and the data driver shown in FIG. 4. FIG. 6 is a block diagram showing a differential signaling system according to an aspect of the present invention. Namely, FIG. 6 is a view illustrating a signal transmission method between the controller and the data driver shown in FIG. 5. FIG. 7 is an equivalent circuitry diagram of the differential signaling system shown in FIG. 6. FIG. 8 is a timing chart showing a differential signal with a skew or a time delay arising from a phase difference of the differential signal inputted to (or transmitted in) the differential transmission line.

With reference to FIG. 5, the flat panel display 300 includes a controller 310 and a data driver 330. The controller 310 receives the image signals DATA [+,−] from an exterior thereof and applies the image signals DATA [+,−] to a first and second wirings W11 and W21. The data driver 330 includes a plurality of data driving circuits 332. The plurality of data driving circuits 332 matches an exterior impedance, and receive the image signals DATA [+,−] from the controller 310 through the first and second wirings W11 and W21.

The controller 310 and the data driving circuits 332 transmit the image signals DATA [+,−] and the control signals CS21, for example, by a low voltage differential signaling (LVDS) transmission method, which transmit the signals (the image signals DATA [+,−] and the control signals CS21) at high speeds. That is, the controller 310 is electrically coupled to the data driver 330 through the first and second wirings W11 and W21. The data driver 330 includes a plurality of the data driving circuits 332. Each of the data driving circuits 332 receives the image signals DATA [+,−] from the controller 310 through the first and second wirings W11 and W21. However, for convenience of a description, wirings for supplying the control signals CS21 are omitted in FIG. 5. As shown in FIG. 5, a pair of first and second wirings W11 and W21 is coupled to each data driving circuit 332. However, in practice, plural pairs of the first and second wirings W11 and W21 can be coupled to each data driving circuit 332.

The first and second wirings W11 and W21 are coupled to the data driving circuit 332, and the first and second wirings W11 and W21 are electrically coupled through respective termination resistors $R_t$ to form a closed circuit. That is, each pair of the first wiring W11 and the second wiring W21 is coupled through one termination resistor $R_t$. Accordingly, the image signals DATA [+,−] from the controller 310 are applied to the terminal resistor $R_t$ with a voltage. The terminal resistor $R_t$ prevents an excessive current from flowing in the data driving circuit 332, and applies to the data driving circuit 332 a particular or constant voltage that is indicative of the image signals DATA [+,−]

Namely, as shown in FIG. 6, in order to transmit data (as image signals DATA [+,−]), an arrangement of differential transmission lines, namely, first and second wirings W11 and W21, are provided between the controller 310, being a sending end Tx, and the data driving circuit 332, being a receiving end Rx. The termination resistor $R_t$ is provided between the differential transmission lines W11, W21 of the data driving circuit 332 being the receiving end. The termination resistor $R_t$ electrically connects the first and second wirings W11 and W21 coupled to each data driving circuit 332, to form a closed circuit.

As described earlier, when only the termination resistor $R_t$ is coupled between the differential transmission lines W11 and W21, a differential impedance $Z_{diff}$ can vary due to external factors, and if a variation of the differential impedance $Z_{diff}$ is not be accurately detected, impedance matching cannot be accurately achieved when using the differential signal transmission method Accordingly, in an aspect of the present invention, a test circuit 335 is coupled to the termination resistor $R_t$ in parallel. The test circuit 335 amplifies a minute variation of differential impedance $Z_{diff}$ and converts the amplified signal into a direct current component, to thereby easily detect the presence of an impedance matching (or matched impedance). That is, the test circuit 335 amplifies a minute variation of the differential impedance $Z_{diff}$ by detecting the minute variation of the differential impedance $Z_{diff}$ and outputting a signal (or a voltage thereof), and then amplifying the signal (or a voltage thereof).

Moreover, the test circuit 335 measures a skew or a time delay arising from a phase difference of a differential signal inputted to (or transmitted in) the differential transmission line, in order to measure the time delay of the differential signal due to the variation of the differential impedance in the differential transmission line.

Namely, as shown in FIG. 8, upon transmitting an image signal [DATA [+,−] and control signals CS21 by a low voltage differential signal (LVDS) transmission method, a skew or a time delay from a phase difference can occur in a differential signal inputted to (or transmitted in) the differential transmission line. In aspects of the present invention, the test circuit 335 measures the skew, the time delay, and/or the phase difference occurring in the differential signal.

The test circuit 335 can be mounted inside a receiving end (such as the data driving circuit 332) of the differential transmission lines W11 and W21, or be coupled to be positioned at an outside thereof. That is, the test circuit 335 can be mounted at a receiving end, namely, inside the data driving circuit 332. However, for a user's control convenience, the test circuit 335 can be installed at an outside of the data driving circuit 332, as shown in FIG. 5.

As shown in FIG. 6, the test circuit 335 includes a differential test amplifier TA, a switching unit that includes two switches S1 and S2, for example, and a peak detector 337. The differential test amplifier TA amplifies a minute variation in differential impedance $Z_{diff}$ to output a voltage that varies according to the variation in the differential impedance $Z_{diff}$. The two switches S1 and S2 are installed at input terminals of the differential test amplifier TA. The peak detector 337 converts the output signal of the differential test amplifier TA into a direct current component. The phase detector 339 measures the skew, the time delay, and/or a phase difference of a differential signal inputted to (or transmitted in) a differential transmission line.

In an aspect of the present invention, the differential test amplifier TA has an input impedance of 50 ohm, and a predetermined amplification gain of G. The differential test amplifier TA amplifies a minute variation of differential impedance $Z_{diff}$ together with the gain G. Namely, the differential test amplifier TA amplifies a signal component, but removes a high frequency noise component of the image signals DATA [+,−]. In the aspect shown, it is preferred, but not required, that a high frequency amplifier embodies the differential test amplifier TA.

Further, it is preferred, but not required, that high speed switches having very small loss embody the switches S1 and S2. An operation of the switches S1 and S2 controls measuring of a voltage $v_T$ (i.e., the voltage across the termination resistor $R_t$) inputted through the differential transmission line. Furthermore, a peak detector 337 converts an output signal ($v_T$) of the differential test amplifier TA into a direct current component ($V_T$). Namely, the peak detector 337 converts a high frequency output signal ($v_T$) of the differential test amplifier TA into a direct current component ($V_T$). Here, the peak detector 337 is preferably embodied by a peak detector having an envelope detection constant γ of 1.

Furthermore, the phase detector 339 measures skew, time delay, and/or a phase difference of a differential signal inputted to (or transmitted in) the differential transmission line, in order to measure the time delay of the differential signal due to a variation of the differential impedance in the differential transmission line.

Here, as shown in FIG. 6, the phase detector 339 is coupled to first and second wirings W11 and W21 functioning as the differential transmission line. Respective switches S3 and S4 are respectively provided to be coupled to the wirings W11 and W21, respectively. Accordingly, when the switches S3 and S4 are closed, the phase detector 339 operates.

As illustrated earlier, in the aspect of the present invention, the differential test amplifier TA amplifies a variation value of an impedance of the differential transmission line, namely, a minute variation of the differential impedance to more clearly detect a degree of variation of the impedance of the differential transmission line, and the peak detector 337 converts a final output signal into a direct current voltage, as shown, to easily measure and detect results thereof using a direct current (DC) meter 340.

In addition, the phase detector 339 detects a time delay between differential signals due to a phase difference occurring in a variation of a differential impedance in a differential transmission line. Here, a phase meter 350 more easily measures the time delay. Namely, when transmitting an image signal DATA [+,−] and control signals CS21 by a low voltage differential signal (LVDS) transmission methods, a skew, a time delay, and/or phase difference can occur in a differential signal inputted to (or transmitted in) the differential transmission line. In aspects of the present invention, the test circuit 335 measures the skew, the time delay, and/or the phase difference occurring in the differential signal.

FIG. 7 is an equivalent circuitry diagram of the differential signaling system shown in FIG. 6. That is, when it is assumed that an input impedance $Z_{in(TA)}$ is 50Ω, a termination resistance $R_T$ is 100Ω, and an impedance $Z_0$ of a transmission line is 50Ω, the differential signaling system can be expressed by an equivalent circuit diagram, as shown in FIG. 7. However, the equivalent circuit diagram shows a case that two switches S1 and S2 connected to input terminals of the differential test amplifier TA, and another switching unit that includes two switches S3 and S4, for example, connected to the first and second wirings W11 and W21, respectively, and coupled to the phase detector 339, are closed. When the four switches S1 to S4 are closed, a minute variation value of the differential impedance can be measured.

Namely, when the two switches S1 and S2, connected to input terminals of the differential test amplifier TA, are closed, an output voltage $V_T$ may be measured. Also, when the a switching unit S1 and S2 are closed, a minute variation value of the differential impedance $Z_{diff}$ can be measured. Further, when the two switches S3 and S4 connected to the first and second wirings W1 and W2 and coupled to the phase detector 339 are closed, a phase delay degree $\Delta\theta_T$ can be measured.

The following is a detailed explanation of an operation and a principle for measuring the minute variation of the differential impedance in the differential signaling system according to an aspect of the present invention with reference to FIG. 7. The principle for measuring the minute variation of the differential impedance in the differential signaling system is to detect deviation between an impedance $Z_0$ of the transmission line and two input impedances, namely, the termination resistance $R_T$ and an input impedance $Z_{in(TA)}$ of the differential test amplifier.

Namely, the differential test amplifier TA included in the test circuit (235, 335) detects the aforementioned deviation. When defects in the transmission line (W11, W21) or impedance mismatching due to a minute variation of the impedances occur, an output voltage of the differential test amplifier TA is measured to obtain a degree of variation in the impedances.

With reference to FIG. 6 and FIG. 7, input and output voltages of the test circuit (235, 335) when no defects occur in the transmission line (W11, W21), can be expressed by following equations 2 to 5.

$$\begin{aligned} v_{in}^{+} - v_{in}^{-} &= \frac{(R_T \,//\, Z_{in(TA)})}{2Z_0 + (R_T \,//\, Z_{in(TA)})} v_{s+} \\ &= \frac{(100 \,//\, 500)}{100 + (100 \,//\, 50)} v_{s+} \\ &= \frac{1}{4} v_{s+} \\ &= 0.25 v_{s+} \end{aligned} \quad \text{[Equation 2]}$$

$$v_T = G \times (v_{in}^{+} - v_{in}^{-}) = 0.25 G v_{s+} \quad \text{[Equation 3]}$$

$$V_T = \gamma v_{T(peak)} = \gamma G \times (v_{in(peak)}^{+} - v_{in(peak)}^{-}) \quad \text{[Equation 4]}$$

$$\Delta\theta_T = 2\pi f (t_2 - t_1) \rightarrow (t_2 - t_1) = \frac{\Delta\theta_T}{2\pi f} \quad \text{[Equation 5]}$$

where, G represents a voltage gain of the differential test amplifier, $v_{s+}$ represents an input voltage of the differential signal, which is a data voltage transmitted through the transmission line, γ is an envelope detection constant of the peak detector, and f is an operation frequency.

For example, when the G is 10, γ is 1, and $v_{S+}$ is 500 mV, input and output voltages of the test circuit are expressed by following equation 6 to 9.

$$v_{in}^{+} - v_{in}^{-} = 0.25 \times 500 \text{ mV} = 125 \text{ mV} \quad \text{[Equation 6]}$$

$$v_T = 10 \times 125 \text{ mV} = 1250 \text{ mV} \quad \text{[Equation 7]}$$

$$V_T = 1 \times 10 \times 125 \text{ mV} = 1250 \text{ mV} \quad \text{[Equation 8]}$$

$$t_2 - t_1 = \frac{\Delta\theta_T}{2\pi f} = 0 \quad \text{[Equation 9]}$$

In contrast to this, input and output voltages of the test circuit (235, 335) when defects occur in the transmission line (W11, W21), can be expressed by following equations 10 to 13.

$$\overline{v_{in}^{+} - v_{in}^{-}} = \frac{(R_T \,//\, Z_{in(TA)})}{2\overline{Z_0} + (R_T \,//\, Z_{in(TA)})} v_{s+} \quad \text{[Equation 10]}$$

$$\overline{v_T} = G \times (\overline{v_{in}^{+} - v_{in}^{-}}) \quad \text{[Equation 11]}$$

$$\overline{V_T} = \gamma \overline{v_{T(peak)}} = \gamma G \times \overline{(v_{in(peak)}^{+} - v_{in(peak)}^{-})} \quad \text{[Equation 12]}$$

$$\overline{\Delta\theta_T} = 2\pi f \overline{(t_2 - t_1)} \rightarrow \overline{(t_2 - t_1)} = \frac{\overline{\Delta\theta_T}}{2\pi f} \quad \text{[Equation 13]}$$

Namely, the bar (–) indicates input and output voltages of the test circuit (235, 335) when defects occur in the transmission line (W11, W21).

For example, when the impedance $Z_0$ of the transmission line (W11, W21) changes from 50Ω to 25Ω due to unexpected ambient environment, the operation frequency is 4 MHz, and a phase difference measured due to a phase delay after a variation in an impedance $Z_0$ of the transmission line, namely, $\Delta\theta_T$=10°=(10/360)2π, the equations 10 to 13 can be expressed by following equations 14 to 17.

$$\begin{aligned} \overline{v_{in}^{+} - v_{in}^{-}} &= \frac{(100 \,//\, 50)}{50 + (100 \,//\, 50)} v_{s+} \\ &= 0.4 v_{s+} = 0.4 \times 500 \text{ mV} \\ &= 200 \text{ mV} \end{aligned} \quad \text{[Equation 14]}$$

$$\overline{v_T} = 10 \times 200 \text{ mV} = 2\text{V} \quad \text{[Equation 15]}$$

$$\overline{V_T} = 1 \times 10 \times 200 \text{ mV} = 2 \text{ V} \quad \text{[Equation 16]}$$

$$\overline{t_2 - t_1} = \frac{\overline{\Delta\theta_T}}{2\pi f} = \frac{(10/360)2\pi}{2\pi \times 4 \times 10^6} \approx 6.94 \text{ ns} \quad \text{[Equation 17]}$$

As understood through the aforementioned example, when the impedance $Z_0$ of the transmission line changes by 50%, namely, from 50Ω to 25Ω, it is observed that an output voltage of the test circuit changes from 750 mV to 2V. Since this indicates a great voltage variation, a degree of variation in the impedances can be easily detected.

That is, in aspects of the present invention, a variation value of impedance, namely, minute variation of the differential impedance in the differential transmission line is amplified to clearly detect a variation degree thereof. Further, since the peak detector 337 converts a final output signal into a direct current voltage, as shown, a DC meter 340 can easily measure and detect results thereof.

In addition, the phase detector 339 may detect a time delay between differential signals due to a phase difference occurring in a variation of a differential impedance in a differential transmission line. Here, a phase meter 350 may easily measure the time delay.

In other words, aspects of the present invention may clearly detect a presence of an impedance matching by a test circuit in a flat panel display using a signal transmission method for transmitting differential signals by detecting the time delay between the differential signals due to a phase difference caused by the variation of the differential impedance in the differential transmission line, and clearly perform an impedance matching through the detection thereof, in which the test circuit amplifies the minute variation of the differential impedance and converts the amplified signal into a direct current component, thereby easily detecting the presence of the impedance matching.

Aspects of the present invention are better in detecting the minute variation in the differential impedance compared to a case of measuring the minute variation in the differential impedance across a termination resistor $R_T$ without the test circuit.

For comparison purposes, measuring a voltage variation before and after a 50% variation of impedance in the transmission line in a typical case without the test circuit, when the input voltage $v_{s+}$ is 500 mV, are expressed by following equations 18 and 19, respectively.

$$\begin{aligned} v_{in}^{+} - v_{in}^{-} &= \frac{R_T}{2Z_0 + R_T} v_{s+} \\ &= \frac{100}{200}(500 \text{ mV}) \\ &= 250 \text{ mV} \end{aligned} \quad \text{[Equation 18]}$$

$$\begin{aligned} \overline{v_{in}^{+} - v_{in}^{-}} &= \frac{R_T}{2\overline{Z_0} + R_T} v_{s+} \\ &= \frac{100}{150}(500 \text{ mV}) \approx 333 \text{ mV} \end{aligned} \quad \text{[Equation 19]}$$

That is, a measured voltage variation rate=(333-250)×100%/250=33%.

Furthermore, in a typical method, a measured time delay is dependant on a band width and precision of an oscilloscope.

In comparison, in the aspect of the present invention described earlier with reference to FIG. 7, a measured voltage variation before and after a 50% variation of impedance in the transmission line are expressed by the equations 8 and 16. Namely, the measured voltage variation rate=(2000–750)×100%/750=140%. Further, the time delay can be measured in terms of approximately several nsec as illustrated in the equation 17.

Accordingly, in aspects of the present invention, since a test circuit amplifies and detects a minute variation of differential impedance due to defects in a transmission line, it has a greater measured voltage variation rate in comparison with a typical case. Accordingly, aspects of the present invention can more accurately or readily detect the minute variation of the differential impedance and perform a more accurate impedance matching through the detection of the minute variation of the differential impedance.

Moreover, a typical method uses an expensive oscilloscope to detect or observe the measured voltage. However, in aspects of the present invention, because the peak detector 337 and the phase detector 339 can detect a direct current component $V_T$ and phase delay degree $\Delta\theta_T$, a variation and a value of the impedance (or the deferential impedance) in the transmission line can be detected by using a simple DC meter 340 and phase detector 350.

As is seen from the forgoing description, aspects of the present invention may more clearly detect a presence of an impedance matching by using a test circuit in a flat panel display using a differential signal transmission method to transmit a differential signal and more clearly perform an impedance matching through the detection of the matched impedance in order to stably transmit a high speed signal without an electro magnetic interference, in which the test circuit amplifies the minute variation of the differential impedance and converts the amplified signal into a direct current component, thereby easily detecting the presence of the impedance.

In addition, the test circuit measures a skew, a time delay, and/or a phase difference of a differential signal inputted to (or transmitted in) the differential transmission line, to thereby measure the time delay of the signal due to a variation of an impedance in the differential transmission line. This allows an impedance matching to be more accurately performed.

In aspects of the present invention, minute variance of the impedance refers to ver small changes in the impedances of between several tens of ohms to several milliohms, or smaller.

In aspects of the present invention, a differential signaling system transmits a signal having different modes but having a same amplitude and a different polarity through a differential transmission line.

Various methods for transmitting the high speed signals between components through wirings includes, a signal transmission method such a low voltage differential signaling (LVDS) method or a reduced swing differential signaling (RSDS) method for transmitting a differential signal.

Various flat panel displays includes a liquid crystal display (LCD), a plasma display panel (PDP), a field emission display (FED), and an organic light emitting display (OLED).

In various aspects, and/or refers to alternatives chosen from available elements so as to include one or more of the elements. For example, if the elements available include elements X, Y, and/or Z, then and/or refers to X, Y, Z, or any combination thereof.

Although a few aspects of the present invention have been shown and described, it would be appreciated by those skilled in the art that changes may be made in the aspects without departing from the principles and spirit of the invention, the scope of which is defined in the claims and their equivalents.

What is claimed is:

1. A differential signaling system comprising:

a differential signal line having a first wiring and a second wiring coupled between a sending end and a receiving end of the system;

a termination resistor coupled between the first wiring and the second wiring in the receiving end side of the system; and a test circuit coupled to the termination resistor in parallel to amplify and detect a variation of a differential impedance due to the differential signal line, wherein the test circuit includes:

a differential test amplifier to amplify the variation in the differential impedance of the first wiring or the second wiring, a switching unit installed at an input terminal of the differential test amplifier used for controlling an operation of the differential test amplifier, a peak detector to convert an output signal of the differential test amplifier into a direct current component, and a phase detector connected to the first wiring and the second wiring of the differential signal line to detect a phase difference of a differential signal transmitted in the differential signal line.

2. The differential signaling system as claimed in claim 1, wherein the test circuit is positioned at an outside of the receiving end.

3. The differential signaling system as claimed in claim 1, wherein the differential test amplifier has an input impedance value and an amplification gain value.

4. The differential signaling system as claimed in claim 1, wherein the peak detector has an envelope detection constant of 1.

5. The differential signaling system as claimed in claim 1, wherein the phase detector includes another switching unit which is coupled to the first and second wirings.

6. A flat panel display comprising:

a display panel in which a plurality of data wirings and gate wirings are arranged to intersect each other;

a controller to receive an image signal from an exterior and to generate a control signal, and to output the image signal and the control signal through a differential signal line having the first and second wirings;

a gate driver to receive the control signal from the controller and apply a scan signal to the gate wirings;

a data driver including a plurality of data driving circuits to receive the image signal and/or the control signal from the controller through the first and second wirings and apply the image signal to the data wirings; and a test circuit coupled to a termination resistor in parallel to amplify and detect a variation of a differential impedance due to the differential signal line, the termination resistor being coupled between the first and second wirings of the differential signal line, wherein the test circuit includes:

a differential test amplifier to amplify the variation in the differential impedance of the first wiring or the second wiring, a switching unit installed at an input terminal of the differential test amplifier used for controlling an operation of the differential test amplifier, a peak detector to convert an output signal of the differential test amplifier into a direct current component, and a phase detector connected to the first wiring and the second wiring of the differential signal line to detect a phase difference of a differential signal transmitted in the differential signal line.

7. The flat panel display as claimed in claim 6, wherein the test circuit is positioned at an outside of the data driving circuits.

8. The flat panel display as claimed in claim 6, wherein the differential test amplifier has an input impedance value and an amplification gain value.

9. The flat panel display as claimed in claim 6, wherein the peak detector has an envelope detection constant of 1.

10. The flat panel display as claimed in claim 6, wherein the phase detector includes another switching unit which is coupled to the first and second wirings.

11. The differential signaling system as claimed in claim 1, wherein the phase difference is detected as a skew or a time delay in modes of the differential signal.

12. The flat panel display as claimed in claim 6, wherein the phase difference is detected as a skew or a time delay in modes of the differential signal.

13. A differential signaling circuit, comprising:

a sending end and a receiving end of the differential signaling circuit;

a first wiring and a second wiring to connect the sending end and the receiving end, and to carry a differential signal between the sending end and the receiving end; and a test circuit positioned at the receiving end and connected to the first and second wirings, the test circuit detecting a phase difference of a differential signal transmitted in the differential signal line which is indicative of an impedance variance in the differential signaling circuit;

wherein the test circuit comprises:

a differential test amplifier that generates an amplified output signal from an output signal that is based on a signal voltage of the differential signal, and a variance in a voltage of the amplified output signal is also indicative of the impedance variance in the differential signaling circuit;

a peak detector that converts the amplified output signal into a direct current component; and a phase detector to detect the phase difference.

14. The differential signaling circuit of claim 13, wherein the phase difference is detected as a skew or a time delay in different modes of the differential signal.

15. The differential signaling circuit of claim 13, wherein the impedance variance in the differential signaling circuit corresponds to a change in an impedance of the first and/or second wirings.

16. The differential signaling circuit of claim 13, wherein the test circuit detects and amplifies a variation of a differential impedance in the differential signaling circuit and converts the amplified variation into a direct current component, to thereby easily detect a presence of an impedance matching in the differential signaling circuit.

17. A flat panel display including the differential signaling circuit of claim 13, comprising:

a display panel in which a plurality of data wirings and gate wirings are arranged to intersect each other;

a controller to receive an image signal, to generate control signals, and to output the image signal and the control signals as the differential signal through the first and second wirings;

a gate driver to receive the control signals from the controller and apply a scan signal to the gate wirings; and a data driver including a plurality of data driving circuits to receive the image signal and/or the control signals from the controller through the first and second wirings and to apply the image signal to the data wirings.

18. A method of detecting a variance in an impedance of a differential signaling circuit, comprising:

transmitting a differential signal over a first wiring and a second wiring of the differential signaling circuit to connect a sending end and a receiving end of the differential signaling circuit;

detecting a skew or a time delay in different modes of the differential signal, which is indicative of an impedance variance in the differential signaling circuit;

obtaining a signal voltage of the differential signal and generating an output signal based on the signal voltage of the differential signal; and amplifying the output signal to generate an amplified output signal, and amplifying a variance in a voltage of the amplified output signal that is also indicative of the impedance variance in the differential signaling circuit.

19. The method of claim 18, wherein the impedance variance in the differential signaling circuit corresponds to a change in an impedance of the first and/or second wirings.

* * * * *